United States Patent [19]
Ito et al.

[11] Patent Number: 5,399,871
[45] Date of Patent: Mar. 21, 1995

[54] PLASMA FLOOD SYSTEM FOR THE REDUCTION OF CHARGING OF WAFERS DURING ION IMPLANTATION

[75] Inventors: Hiroyuki Ito; Jonathan England; Frederick Plumb; Ian Fotheringham, all of West Sussex, England

[73] Assignee: Applied Materials, Inc., Santa Clara, Calif.

[21] Appl. No.: 243,053

[22] Filed: May 16, 1994

Related U.S. Application Data

[63] Continuation of Ser. No. 984,670, Dec. 2, 1992, abandoned.

[51] Int. Cl.$^6$ .......................................... H01J 37/317
[52] U.S. Cl. .............................. 250/492.21; 250/251
[58] Field of Search ................. 250/492.21, 492.2 R, 250/251, 398, 492.3

[56] References Cited

U.S. PATENT DOCUMENTS

| | | | |
|---|---|---|---|
| 3,523,210 | 8/1970 | Ernstene et al. | 315/111 |
| 4,675,530 | 6/1987 | Rose et al. | 250/492.2 |
| 4,806,829 | 2/1989 | Nakao | 250/251 |
| 4,994,674 | 2/1990 | Tamai et al. | 250/492.2 |
| 5,089,710 | 2/1992 | Kikuchi | 250/492.3 |
| 5,262,652 | 11/1993 | Bright et al. | 250/492.2 |
| 5,904,902 | 2/1990 | Tamai et al. | 315/111.81 |

FOREIGN PATENT DOCUMENTS 0104818  4/1984  European Pat. Off. .
4-99273  3/1992  Japan .

OTHER PUBLICATIONS

Strain et al., "New approaches to charging control," Nuclear Instruments and Methods in Physics Research, vol. B55, 1991, pp. 97–103.

Nasser-Ghodsi et al., "A high-current ion implanter system," Nuclear Instruments and Methods in Physics Research, vol. B55, 1991, pp. 398, 401.

*Primary Examiner*—Paul M. Dzierzynski
*Assistant Examiner*—Kiet T. Nguyen
*Attorney, Agent, or Firm*—Robert R. Meads

[57] ABSTRACT

A plasma flood system for use in the implantation of ions in a semiconductor substrate comprising a plasma and low energy electron source for developing a plasma containing low energy electrons for magnetic field enhanced transmission to a negatively biased, magnetic field assisted electron confinement tube and into an ion beam flowing axially through the tube to the semiconductor substrate for self regulating and neutralizing positive charges on the surface of the substrate without causing significant negative charging of the substrate.

24 Claims, 5 Drawing Sheets

PLASMA FLOOD SYSTEM FOR THE REDUCTION OF CHARGING OF WAFERS DURING ION IMPLANTATION

This is a continuation of U.S. application Ser. No. 07/984,670, filed Dec. 2, 1992, now abandoned.

BACKGROUND

The present invention relates to the "doping" of semiconductors by the implantation of ions into semiconductor substrates and, more particularly, to an improved plasma flood system for use in ion implantation equipment.

In the manufacture of semiconductors, it is common practice to implant specific species of ions at high doses into semiconductor substrates in the form of semiconductor wafers. The equipment utilized to perform such ion implantation usually comprises an ion source, a mass analyzer having an ion acceleration tube input and output to transport ions to a semiconductor wafer supported on a rotating and transversely moveable disk. In addition, the equipment includes a monitoring system for monitoring the ion beam current in order to control the dose of ions being implanted. The monitoring system commonly employs a Faraday "cage" before the wafer or either a Faraday "cage" or a magnetically suppressed beam stop after the wafer.

As the ions are implanted in the semiconductor, the surface of the semiconductor wafer becomes positively charged. If the surface charge reaches a value greater than the insulation breakdown voltage for an insulating film on the semiconductor wafer, the insulating film will break down. To prevent such an occurrence, it is common for ion implantation equipment to include an electron flood gun or similar device for directing onto the wafer surface a stream or "flood" of electrons which offsets and at least partially neutralizes the buildup of positive charge on the surface of the semiconductor wafer.

An example of such a combination is described in U.S. Pat. No. 5,089,710 issued Feb. 18, 1992 for "Ion Implantation Equipment". The patent describes equipment including a Faraday tube located adjacent a semiconductor wafer for receiving an ion beam. The Faraday tube is provided to monitor beam current and to prevent secondary electrons which are generated when the ions are implanted in the surface of the semiconductor wafer from escaping the Faraday system. The Faraday tube is positively biased relative to a plasma generation chamber mounted through a wall of the Faraday tube. The plasma generation chamber is placed at a position where a filament in the chamber does not face the semiconductor wafer. Argon gas is introduced into the plasma chamber and thermoelectrons emitted from the filament act on the gas to generate a plasma. Electrons at energies above 13 eV pass with the plasma through a small exit aperture in the plasma generation chamber into the ion beam in the Faraday tube. The Faraday tube is maintained at a positive potential and effects an extraction and acceleration of the electrons from the plasma generation chamber to higher energy levels. Such high energy electrons in striking the wall surface of the Faraday tube produce secondary electrons whose statistical energy distribution typically extends to well over 20 eV.

A serious shortcoming of the design described in the '710 patent is that the electron current flow must be adjusted extremely critically to prevent charge build-up on the wafer. In particular, if the electron current is adjusted slightly too high, the electrons have such a high energy level distribution that they will not be deflected from impinging the wafer, even if the wafer already has accumulated a negative charge. A further disadvantage of this design is that the positively biased Faraday rapidly attracts and absorbs low energy primary electrons and low energy secondary electrons produced at the surface of the semiconductor wafer which otherwise would be useful in neutralizing positive charging of the wafer surface.

SUMMARY OF THE INVENTION

The present invention provides an improved plasma electron flood system which emits a stream of low energy electrons, the majority preferably being less than 5 eV, toward a workpiece such as a semiconductor wafer which is being bombarded by an ion beam. Such low energy electrons spill from a plasma generation chamber into, and are confined by, a negatively biased electron guide or confinement tube through which an ion beam passes to a semiconductor substrate. The confinement tube extends to almost touch the workpiece to minimize the escape of electrons between the tube and the workpiece.

The negative bias of the electron confinement tube relative to the primary source of electrons in the plasma chamber (for example, a heated filament) decelerates and reduces the energy of the electrons entering the confinement tube. At the wafer, the low energy electrons immediately flow to any positively biased surface to neutralize the surface charge as it begins to become positive. Since any small negative voltage on the surface of the wafer will repel low energy electrons of comparable energy or less, supplying a large amount of low energy electrons creates a self regulating charge neutralization system with minimum negative charging of the substrate.

As compared with the prior art and particularly the system described in the above referenced United States Patent, the present invention floods the substrate with a large flux of lower energy electrons which more effectively neutralize any positive charge on the surface of the semiconductor substrate in a self-regulating manner which minimizes undesired negative charging of the substrate. In addition, the negatively biased confinement tube limits the maximum negative voltage to which the substrate can charge up, and the tube advantageously confines low energy secondary electrons at the surface of the substrate so they can contribute to neutralizing positive charge build up on the substrate.

The present invention preferably incorporates magnets adjacent the plasma generation chamber for generating a magnetic field which enhances the density of the plasma and the extraction of the low energy electrons from the plasma chamber into the guide tube. The present invention also preferably includes arrays of magnets along the electron confinement tube for generating magnetic fields which assist in the containment of the low energy electrons traveling with the ion beam.

DETAILED DESCRIPTION OF THE PREFERRED EMBODIMENTS

Generally speaking, the plasma flood system of the present invention comprises a plasma source and low energy electron generator 12 and a negatively biased electron confinement or guide tube 10.

Figure 3:
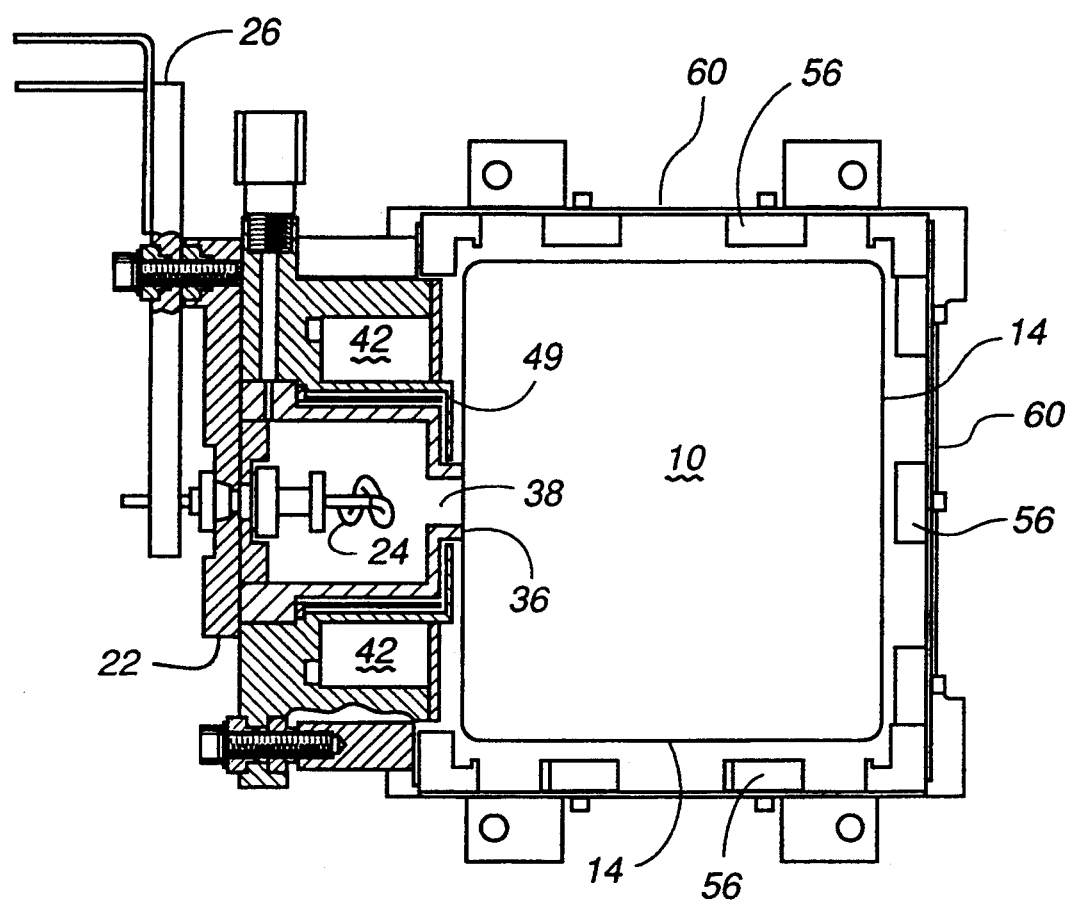
FIG. 3 is a transverse sectional view of the plasma flood system.
Figure 4:
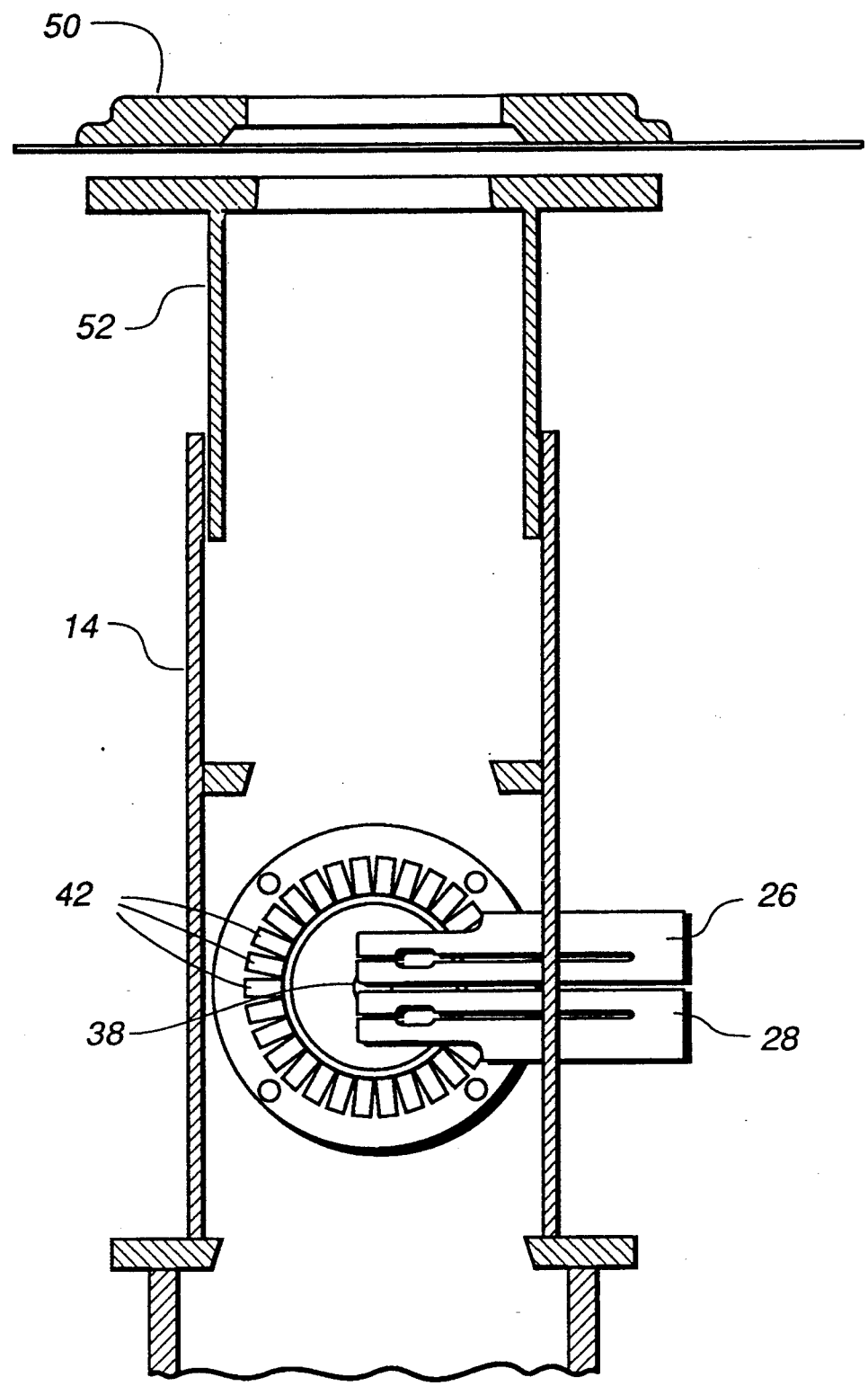
FIG. 4 is a schematic side plan view of the plasma flood system.

The guide tube 10 preferably has graphite mesh walls 14 with a square cross section as shown in FIG. 3. However, the tube walls can be composed of any electrically conductive material, can be either solid or perforated, and can have a circular or any other cross section. It is well known to fabricate of graphite any electrodes that have contact with an ion beam because metal electrodes would contaminate the beam. Each of the four walls 14 of guide tube 10 is preferably a simple rectangular graphite mesh plate which is supported by an outer aluminum frame 60.

The tube 10 is positioned to axially receive and pass an ion beam 16 to a semiconductor substrate such as a semiconductor wafer 18 mounted on a processing wheel (not shown) carrying a plurality of wafers 18, 19 and 20. The wheel spins causing the wafers to move rapidly in the plane of the drawing as well as perpendicular to the drawing. When the wheel moves the wafers out of the ion beam 16, the beam passes to a conventional beam stop collector 21 for measuring ion beam current, and hence, ion dosage. For example, the beam stop 21 can be a conventional Faraday cage, or, more preferably, a magnetically suppressed beam stop collector as is included in Model 9200 ion implanters commercially sold by Applied Materials, Inc. The placement of the collector 21 after the wafer support wheel eliminates any requirement that the plasma flood of the present invention also function as a Faraday cage or part of a Faraday system for dosimetry purposes.

The plasma and low energy electron generator 12 comprises a plasma chamber 22 containing a filament coil 24, such as a conventional "Bernas" style filament, with terminals 26 and 28 mounted in a top 30 of the chamber and connected to an adjustable current source 32 for supplying up to about 200 A at voltages between −2 and −5 volts D. C.

An inert gas such as argon (or, less preferably, xenon) is pumped into the cylindrical plasma chamber 22 from a gas supply line 34, preferably at a flow rate of about 1 sccm. The gas then flows from the chamber into the interior of the guide tube 10 via exit aperture or extraction aperture 38. The aperture preferably is at least 3 mm wide. In the preferred embodiment, the aperture is a circular opening having a 10 mm diameter. The flow rate of the gas should be high enough to produce a sufficient gas pressure in the chamber 22 to produce, as will be described below, a high enough plasma density in the chamber to generate the desired flux of electrons through the aperture 38 and, ultimately, toward the substrate 18. Increasing the size of the aperture improves the efficiency of electron extraction through the aperture, but also increases the gas flow rate required to maintain sufficient gas pressure in the chamber 22.

In operation, the current flow through the filament 24 heats it so that the filament thermionically emits electrons into the plasma chamber. A voltage source 46 connected between the filament and the chamber housing 44 biases the chamber wall to a positive voltage, preferably less than 60 volts, and more preferably about 30 volts, relative to the filament. This voltage, in combination with the thermionic electron emission from the filament, causes a breakdown of the gas in the chamber so as to produce a plasma. The plasma greatly increases the thermionic emission from the filament. Largely due to diffusion, a fraction of the free electrons will exit the plasma chamber 22 through the aperture 38 and will enter the guide tube or confinement tube 10. A short nozzle 40 which is electrically connected to the chamber walls extends the aperture 38 to be almost flush (coplanar) with the inner surface of the guide tube wall 14.

Figure 1:
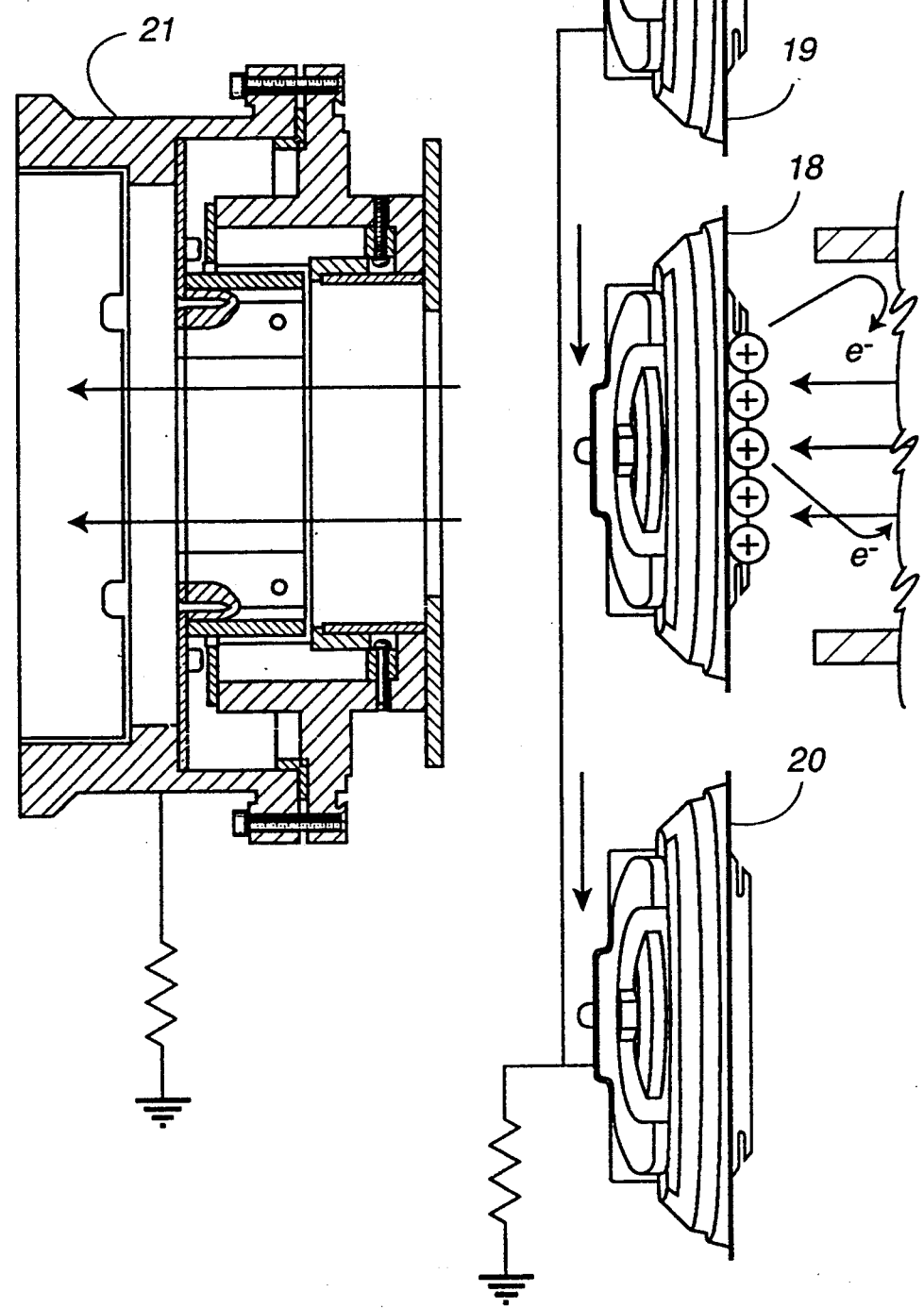
FIG. 1 is a longitudinal section view of the plasma flood system comprising the present invention.
Figure 1:
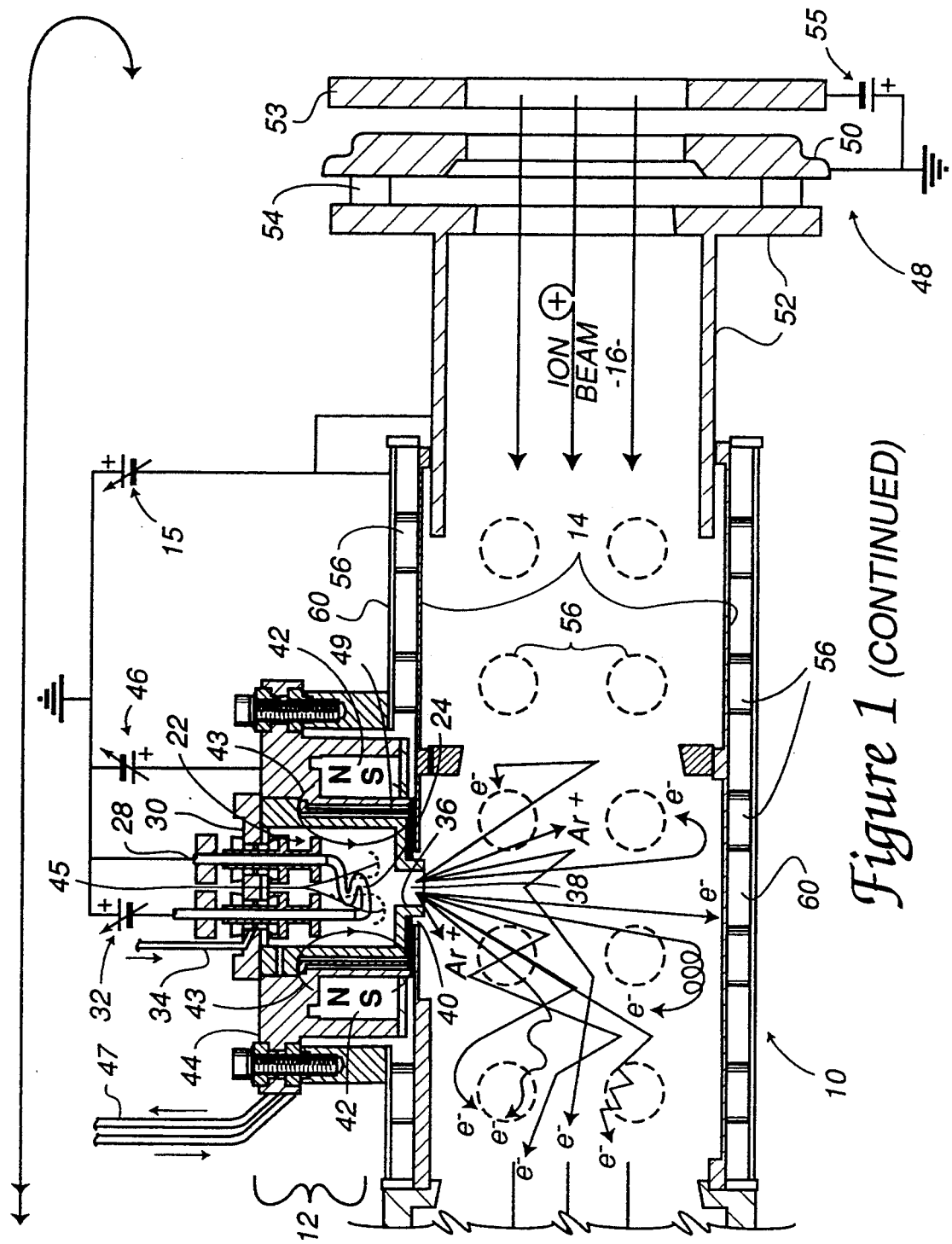

Surrounding the filament 24 and supported in an outer housing 44 are a plurality of plasma enhancement magnets 42. The plasma enhancement magnets 42 are arranged with their magnetic axes aligned in the same direction parallel to the adjacent cylindrical side walls of the chamber and parallel to the respective longitudinal axes of both the chamber itself and the exit aperture 38. Accordingly, they generate magnetic flux lines, as illustrated by the lines 43 in FIG. 1, which are parallel to the adjacent cylindrical side walls of the chamber 22 and to the axis of the exit aperture 38. The current flow in the filament 24 also generates a magnetic field as depicted by the dotted lines 45 in FIG. 1.

The plasma inside the plasma chamber 22 generates heat which could cause the magnets to become demagnetized. To keep the magnets cool, a heat shield 49 is interposed between the magnets and the adjacent chamber walls. In addition, a cooling fluid such as water is circulated through passages 47 in the housing 44 surrounding the magnets.

The fields produced by the plasma enhancement magnets 42 increase the density of the plasma so as to increase the number of electrons produced in the chamber and reduce the average energy level of the electrons. The magnets also increase the rate at which electrons are extracted through the aperture 38 into the guide tube 10.

An additional power source 15 is connected between the filament and the walls 14 of guide tube or confinement tube 10 so as to bias the guide tube negative relative to the filament, preferably in the range of 0 to −30 volts, and more preferably about −10 volts. This negative voltage causes the electrons extracted from the plasma chamber 22 to experience a net negative extraction voltage, rather than the positive extraction voltage required by conventional electron flood guns. This negative extraction voltage advantageously reduces the energy level of the extracted electrons, and it advantageously makes their energy level independent of the arc voltage 46 applied to the walls of the chamber 22.

As a result of the very low filament voltage 32 (less than 5 volts), the plasma enhancement afforded by magnets 42, and the negative decelerating voltage 15 (−10 volts) applied to the guide tube 10, in the illustrated preferred embodiment the electrons extracted into the guide tube have a median energy level of less than 5 eV. This is a much lower median energy level than is achievable with conventional electron flood guns heretofore used in ion implantation equipment.

Those electrons which leave the plasma chamber 22 through the aperture 38 and enter the interior of the guide tube 10 travel along with the ion beam through the guide tube 10 toward the substrate 18. Electrons of energy levels higher than the negative bias or confinement voltage 15 (preferably −10 volts, as described above) on the guide tube 10 tend to be absorbed by collisions with the tube walls 14. Lower energy electrons are repelled by the negative confinement voltage and continue travelling toward the substrate. Consequently, the negative confinement voltage on the guide tube advantageously reduces the energy level of the electrons reaching the substrate.

The negative voltage on the guide tube has a similar advantageous effect on the secondary electrons produced by ions impacting the substrate. The higher energy secondary electrons are largely absorbed by collision with the tube, whereas the lower energy electrons are repelled back toward the substrate, thereby beneficially increasing the density of low energy electrons adjacent the substrate. The guide tube is mounted so its downstream end is as close as practicable to the substrate, 10 mm in the preferred embodiment, so as to prevent escape of electrons through the gap between the guide tube and the substrate.

To prevent the positive arc voltage 46 impressed on the plasma chamber walls from attracting electrons that have entered the interior of the guide tube 10, the walls 14 of the guide tube completely cover and directly overlie the adjacent walls of the chamber 22, except for the exit aperture 38. Consequently, the electrons within the guide tube 10 are effectively shielded from the positive arc voltage.

Each of the power supplies 15, 32, and 46 preferably has an adjustable output voltage or current. In general, the filament power supply 32 should be adjusted to provide a high enough current through the filament 24, and therefore high enough thermionic emission of electrons, to produce an adequate electron flood current to neutralize the charge on substrate 18. However, excessive filament current will shorten the life of the filament. More importantly, increasing the filament voltage will increase the energy level of the thermionically emitted electrons. Therefore, it is preferable to use a relatively low resistance filament.

The output voltage of the arc voltage power supply 46 should be high enough to produce a plasma density sufficient to produce an adequate electron flood current to neutralize the substrate, but no higher than necessary so as to prolong the life of the filament.

The confinement power supply 15 should be adjusted to apply a large enough negative voltage to the confinement tube 10 to decelerate the electrons extracted from aperture 38 to energy levels below values that could destroy the semiconductor devices on the wafer 18, as described earlier. However, the voltage on the confinement tube adjacent the wafer determines the maximum negative voltage the wafer can charge up to before the confinement tube begins attracting electrons away from the wafer. Therefore, the negative confinement voltage should be less than the maximum negative voltage to which the wafer can permitted to charge up without device damage.

Still further, in a preferred form of the invention, high voltage electron suppression associated with a post acceleration system 48 prevents electrons from being attracted into the post acceleration region and provides a closed or confined environment for the plasma from the post acceleration system to the plane of the wafer 18. In particular, the post acceleration system 48 shown in FIG. 1 comprises a grounded post-acceleration electrode 50 and a slideable electron confinement tube extension 52 separated from the electrode 50 by an annular insulator 54. The tube extension 52 is slideable to permit the tube to continue abutting the post acceleration electrode as the latter is moved back and forth to focus the ion beam in conventional fashion.

The tube extension 52 is biased by the confinement power supply 15 to the potential of the electron confinement tube 10 while a suppression electrode 53 adjacent the grounded electrode 50 is negatively biased to a voltage of about −5000 volts or more by a voltage supply 55. The suppression voltage must be of a sufficiently high value to prevent penetration of a post acceleration field into the plasma flood system and thus prevent electron flow out of the guide tube into the post acceleration region, and of low enough value to avoid disturbing the projectory of the ion beam to the wafer. In these regards, the electrode 50 and the tube extension 52 pass the ion beam 16 while the suppression electrode 55 inhibits electrons from accelerating into the region of the ion beam upstream of the electron confinement tube 14.

Figure 2:
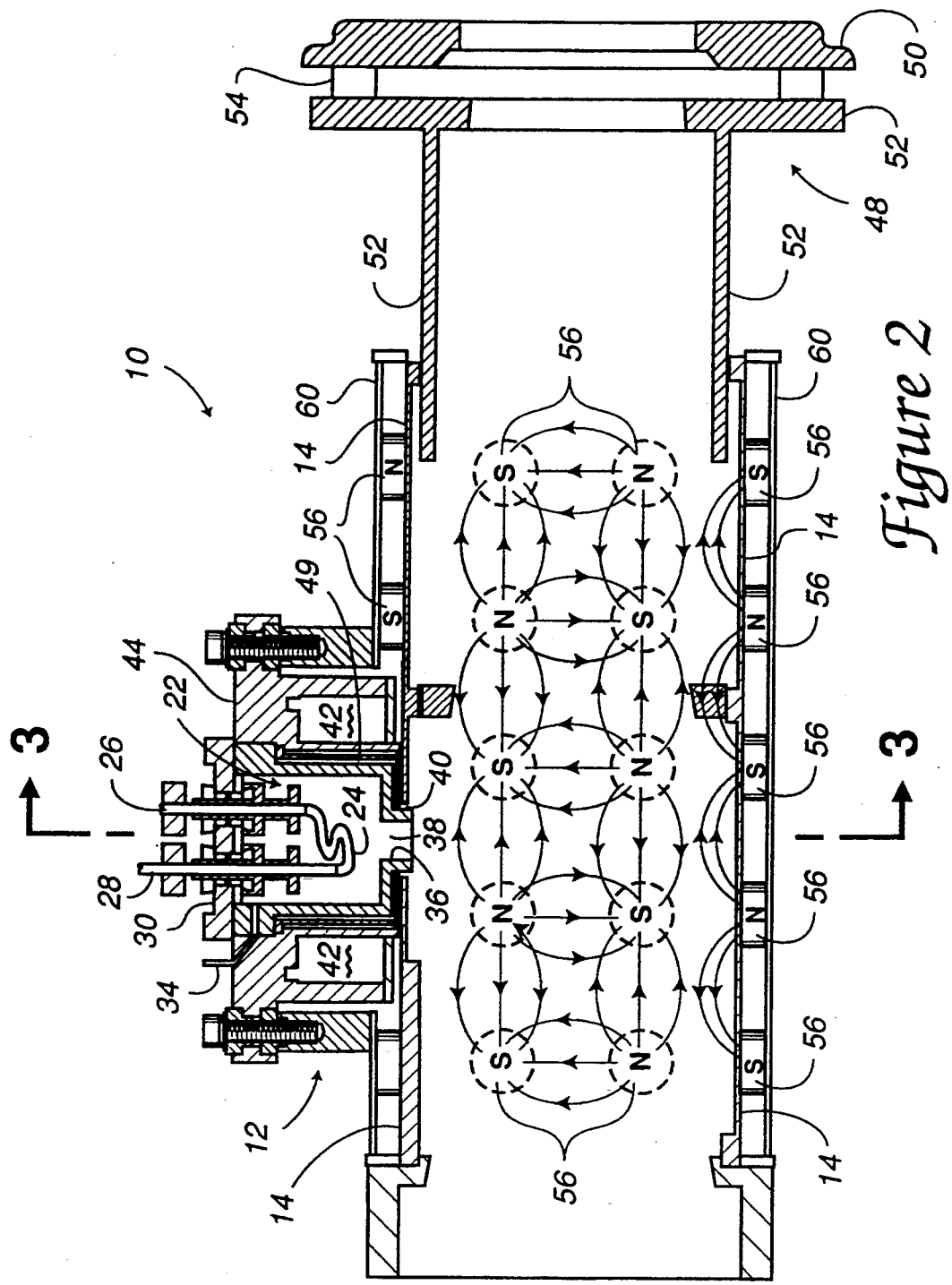
FIG. 2 is an enlarged view of a central portion of the plasma flood system illustrated in FIG. 1 depicting the magnetic fields from the arrays of magnets along the sides of the electron confinement tube included in the system.

To assist in the confinement and transport of low energy electrons within the tube 14, the preferred form of the present invention includes cusp field magnets 56 which may be arranged in arrays extending axially along and spaced circumferentially around the exterior of tube 10 as most clearly depicted in FIG. 2. The magnets 56 of each array are alternatively of North and South polarity and produce axial and circumferential magnetic fields as shown in FIG. 2 to magnetically confine the electrons within the guide tube 10.

In summary, the electron flood system of the present invention emits a steam of very low energy electrons toward the substrate, maintaining a large quantity of very low energy electrons adjacent the substrate surface. These low energy electrons neutralize any charge on the substrate in a self-regulating manner.

Specifically, positive charging of the wafer is prevented because any positive charge will attract electrons until the charge is neutralized. Negative charging of the wafer is limited by two mechanisms. Firstly, the electrons have such a low energy level that the electrons are easily repelled by a small negative charge on the substrate. Secondly, the negative voltage build-up on the substrate cannot exceed the negative confinement voltage on the guide tube, or else electrons will flow from the substrate to the more positive potential on the guide tube.

In comparison with conventional electron flood guns, the present invention achieves a lower electron energy level distribution by not subjecting the emitted electrons to a positive accelerating voltage, but rather using a negative confining voltage relative to the electron source.

We claim:

1. An electron flood system for neutralizing positive charge buildup on a substrate during implantation of ions in the substrate, comprising:
   an electron confinement tube axially receiving and passing an ion beam to a substrate;
   a plasma generation chamber containing a gas for forming a plasma containing low energy electrons and having an exit aperture in communication with an open of the electron confinement tube to pass the low energy electrons into the tube to join the ion beam passing therethrough; and means for negatively biasing the electron confinement tube relative to the substrate to negatively shield the chamber, to control the passage of the low energy electrons into the electron confinement tube, and to contain and intensify the flow of the low energy electrons within and along the ion beam to the substrate to thereby neutralize positive charges on the substrate.

2. The system of claim 1 further comprising first magnetic means adjacent to the chamber for generating a magnetic field to enhance a generation of the low energy electrons in the plasma and their passage into the electron containment tube.

3. The system of claim 2 wherein the first magnetic means includes a plurality of magnets around the chamber for generating magnetic fields sufficient to promote production of the low energy electrons and their passage into the electron containment tube.

4. The system of claim 2 further comprising second magnetic means comprises one or more axially extending arrays of magnets of alternating polarity spaced around the electron containment tube.

5. The system of claim 1 wherein the exit aperture comprises a nozzle extending from the chamber into the electron containment tube.

6. The system of claim 1, wherein said electron confinement tube is negatively biased with respect to said chamber and wherein a portion of said chamber surrounding said exit aperture is shielded from said ion by said negatively biased electron confinement tube.

7. The system of claim 1, wherein said low energy electrons passed into said confinement tube have a median energy level of less than 5 eV.

8. The system of claim 1, wherein said plasma generation chamber further comprises a filament thermionically emitting said low energy electrons.

9. The system of claim 8, wherein said confinement tube is negatively biased relative to said filament.

10. An electron flood system for use in the implantation of ions in a semiconductor substrate, comprising:
a low energy electron source; and
an electron confinement tube for receiving and passing an ion beam to a semiconductor substrate and including an inlet for receiving electrons from the low energy electron source, a portion of said electron confinement tube adjacent said electron source being negatively biased relative to said low energy electron source.

11. The system of claim 10, wherein said low energy electron source comprises a filament thermionically emitting said electrons and said confinement tube is negatively biased relative to said filament.

12. The system of claim 11, wherein said electrons emitted from the low energy electron source have a median energy level of less than 5 eV.

13. The system of claim 10, wherein said low energy electron source contains a plasma and further comprising first magnetic means for enhancing production of the low energy electrons within and passage thereof through the inlet with the plasma into the electron containment tube to flow with the ion beam to the semiconductor substrate to affect a neutralization of positive charge on the substrate.

14. The system of claim 10, wherein said low energy electron source is included within a chamber positively biased relative to said electron confinement tube and having a nozzle penetrating through said inlet of said electron confinement tube, said portion of said negatively biased electron confinement tube surrounding said nozzle and overlying a portion of said positively biased chamber facing said electron confinement tube.

15. The system of claim 14, wherein said chamber contains a plasma containing said low energy electrons.

16. The system of claim 10, wherein the low energy electron source contains a plasma and further comprising first magnetic means for enhancing production of the low energy electrons within and passage thereof through the inlet with the plasma into the electron confinement tube to flow with the ion beam to the semiconductor substrate to affect a neutralization of positive charge on the substrate.

17. A plasma flood system for use in the implantation of ions in a semiconductor substrate, comprising:
a plasma source for forming a plasma containing low energy electrons;
an electron confinement tube is negatively biased relative to said semiconductor substrate for receiving and passing an ion beam to the semiconductor substrate and including an inlet for receiving the plasma from the plasma source;
first magnetic means for enhancing production of the low energy electrons within and passage thereof through the inlet with the plasma into the electron confinement tube to flow with the ion beam to the semiconductor substrate to affect a neutralization of positive charge on the substrate; and
second magnetic means along the tube for generating magnetic fields which enhance electron confinement along the tube to the semiconductor substrate.

18. The system of claim 17 wherein the second magnetic means comprises one or more axially extending arrays of magnets of alternating polarity spaced around the tube.

19. An electron flood system used in an ion implantation system for implanting ions from an ion beam into a substrate, comprising:
a guide tube extending along an axis, receiving said ion beam along said axis, and delivering along said axis said ion beam to said substrate and said guide tube is negatively biased relative to said substrate;
an electron generator generating electrons and delivering said electrons to said ion beam obliquely to said axis; and
first magnetic means along said guide tube adjacent to said electron generator for generating magnetic fields confining said electrons to a vicinity of said ion beam.

20. The system of claim 19, wherein said electron generator comprises a plasma generator chamber including a gas forming a plasma therewithin and a filament thermionically emitting electrons into said plasma, said chamber having a nozzle smaller than a cross section of said chamber communicating with said guide tube.

21. The system of claim 20, further comprising second magnetic means along walls of said chamber for generating magnetic fields parallel to said walls.

22. An electron flood system used in an ion beam system processing a substrate, comprising:
a holder of a substrate;
a tube axially passing an ion beam therethrough and negatively biased relative to said holder; and
an electron source communicating through a first aperture in a side wall of said tube to supply electrons emitted from said electron source therethrough to said ion beam.

23. An electron flood system of claim 22, wherein said electron source comprises a plasma source having a wall including a second aperture communicating with said first aperture and a filament contained therein, and wherein said wall of the plasma source is positively biased relative to said filament.

24. An electron flood system of claim 23, wherein said tube is negatively biased relative to said filament.

* * * * *